(12) United States Patent
Beard et al.

(10) Patent No.: US 12,635,105 B2
(45) Date of Patent: May 19, 2026

(54) COMPUTE-ON-FAN-TRAY-ASSEMBLY (COFTA) SYSTEM

(71) Applicant: Dell Products L.P., Round Rock, TX (US)

(72) Inventors: Neal Beard, Austin, TX (US); Padmanabhan Narayanan, Chennai (IN); Per Henrik Fremrot, Novato, CA (US); Vamshidhar Varre, Hyderabad (IN)

(73) Assignee: Dell Products L.P., Round Rock, TX (US)

( * ) Notice: Subject to any disclaimer, the term of this patent is extended or adjusted under 35 U.S.C. 154(b) by 218 days.

(21) Appl. No.: 18/600,978

(22) Filed: Mar. 11, 2024

(65) Prior Publication Data

US 2025/0287523 A1 Sep. 11, 2025

(51) Int. Cl.
*G06F 1/20* (2006.01)
*H05K 7/20* (2006.01)

(52) U.S. Cl.
CPC ........... *H05K 7/20136* (2013.01); *G06F 1/20* (2013.01); *H05K 7/20209* (2013.01)

(58) Field of Classification Search
CPC ........... H05K 7/20727; H05K 7/20172; H05K 7/20145; H05K 7/1438; H05K 7/20209; H05K 7/20718; H05K 7/20581; H05K 7/20563; G06F 1/20; G06F 1/185; G06F 1/184; G06F 1/206; G06F 1/181; G06F 2200/201; G06F 2213/0026
See application file for complete search history.

(56) References Cited

U.S. PATENT DOCUMENTS

| | | | | |
|---|---|---|---|---|
| 10,372,178 B2 * | 8/2019 | Chang | ...................... | G06F 1/26 |
| 10,729,037 B1 * | 7/2020 | Shearman | .............. | H04Q 1/035 |
| 11,641,726 B1 * | 5/2023 | Jagadeesan | .......... | H05K 7/1417 |
| | | | | 361/679.48 |
| 12,495,514 B2 * | 12/2025 | Su | .......... | F04D 29/601 |
| 2004/0075983 A1 * | 4/2004 | Thompson | ......... | H05K 7/20581 |
| | | | | 361/679.48 |
| 2004/0256334 A1 * | 12/2004 | Chen | .................. | H05K 7/20727 |
| | | | | 211/41.17 |
| 2008/0253076 A1 * | 10/2008 | Chen | ...................... | G06F 1/186 |
| | | | | 361/679.31 |
| 2017/0083057 A1 * | 3/2017 | Bettiga | .................... | G06F 1/185 |
| 2020/0315067 A1 * | 10/2020 | Shearman | .............. | H04Q 1/023 |

* cited by examiner

*Primary Examiner* — Mandeep S Buttar
(74) *Attorney, Agent, or Firm* — Joseph Mencher

(57) ABSTRACT

A Compute-On-Fan-Tray-Assembly (COFTA) system includes a fan chassis that is configured to be positioned in a networking device, and that has a fan module coupling subsystem that is configured to couple at least one fan module to the fan chassis. A compute subsystem is mounted to the fan chassis and is configured to perform compute functionality for the networking device. A networking device connector is included on the fan chassis, is coupled to the compute subsystem, and is configured to engage a compute subsystem connector in the networking device to couple the compute subsystem to a network processing system in the networking device when the fan chassis is positioned in the networking device.

17 Claims, 15 Drawing Sheets

400

FAN MODULE(S) COUPLED TO COFTA SYSTEM
402

COFTA SYSTEM COUPLED TO NETWORKING DEVICE
404

FAN MODULES OPERATED TO COOL NETWORKING DEVICE
406

COMPUTE SUBSYSTEM IN COFTA SYSTEM PERFORMS COMPUTE FUNCTIONALITY FOR NETWORKING DEVICE
408

ACCESS TO COMPUTE SUBSYSTEM REQUIRED?
410

N

Y

COFTA SYSTEM DECOUPLED FROM NETWORKING DEVICE
412

COMPUTE-ON-FAN-TRAY-ASSEMBLY (COFTA) SYSTEM

BACKGROUND

The present disclosure relates generally to information handling systems, and more particularly to a Compute-On-Fan-Tray-Assembly (COFTA) system for use with information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, networking devices such as switches, utilize a Central Processing Unit (CPU) or other compute device in addition to their Network Processing Unit (NPU) in order to provide an operating system (e.g., a Network Operating System (NOS)) for the networking device, perform management operations for the networking device, and/or provide other functionality (e.g., non-data plane functionality) that is not performed by the NPU. For example, conventional networking devices are often provided with a Compute-On-Module (COM) Express device that includes a CPU and that is mounted to a motherboard in the networking device (i.e., using "vertical"/"Z-axis" connectors that connect to corresponding "vertical"/"Z-axis" connectors on the motherboard to position the COM Express device above and parallel to the motherboard) in order to allow that CPU to perform the functionality for the networking device discussed above. However, the use of COM Express devices to provide the CPU in networking devices raises some issues.

For example, COM Express devices may require servicing or replacement for a variety of reasons that include CPU errors, storage device degradation that can prevent the booting of the OS, memory device issues, and/or other COM Express device issues that would be apparent to one of skill in the art in possession of the present disclosure. Furthermore, in many situations, the upgrade (or downgrade) of the COM Express device may be desirable, such as when the NOS requirements for the networking device have changed, storage requirements for the networking device have changed, processing requirements for the networking device have changed, security requirements for the networking device have changed, etc.

However, the COM Express devices discussed above are not designed to be field replaceable. Rather, in order to remove a COM Express device from its networking device, that networking device must be removed from its rack, have its top cover removed (an action that involves the removal of dozens of screws and operates to void the manufacturer warranty in most situations if not performed by an authorized entity), and then the COM Express device must be unscrewed from the motherboard in that networking device. As such, when a COM Express device requires the servicing or replacement described above, its networking device is removed from its rack and that networking device is shipped to an authorized COM Express device servicing/replacement entity, which results in networking device downtime and can be particularly costly as shipping carriers typically use volumetric weighting. Furthermore, the current solution to "upgrading" networking device COM Express devices is to buy a newer generation networking device.

Accordingly, it would be desirable to provide a compute subsystem in a networking device in a manner that addresses the issues discussed above.

SUMMARY

According to one embodiment, an Information Handling System (IHS) includes a networking device chassis that defines at least one fan slot; a network processing system that is housed in the networking device chassis and that is configured to perform networking functionality; a fan chassis that includes at least one fan module and that is positioned in the at least one fan slot defined by the networking device chassis; a compute subsystem that is mounted to the fan chassis and that is configured to perform compute functionality; and a networking device connector that is included on the fan chassis, that is coupled to the compute subsystem, that engages a compute subsystem connector in the networking device chassis to couple the compute subsystem to the network processing system, and that is configured to disengage the compute subsystem connector when the fan chassis is removed from the networking device chassis to decouple the compute subsystem from the network processing system.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
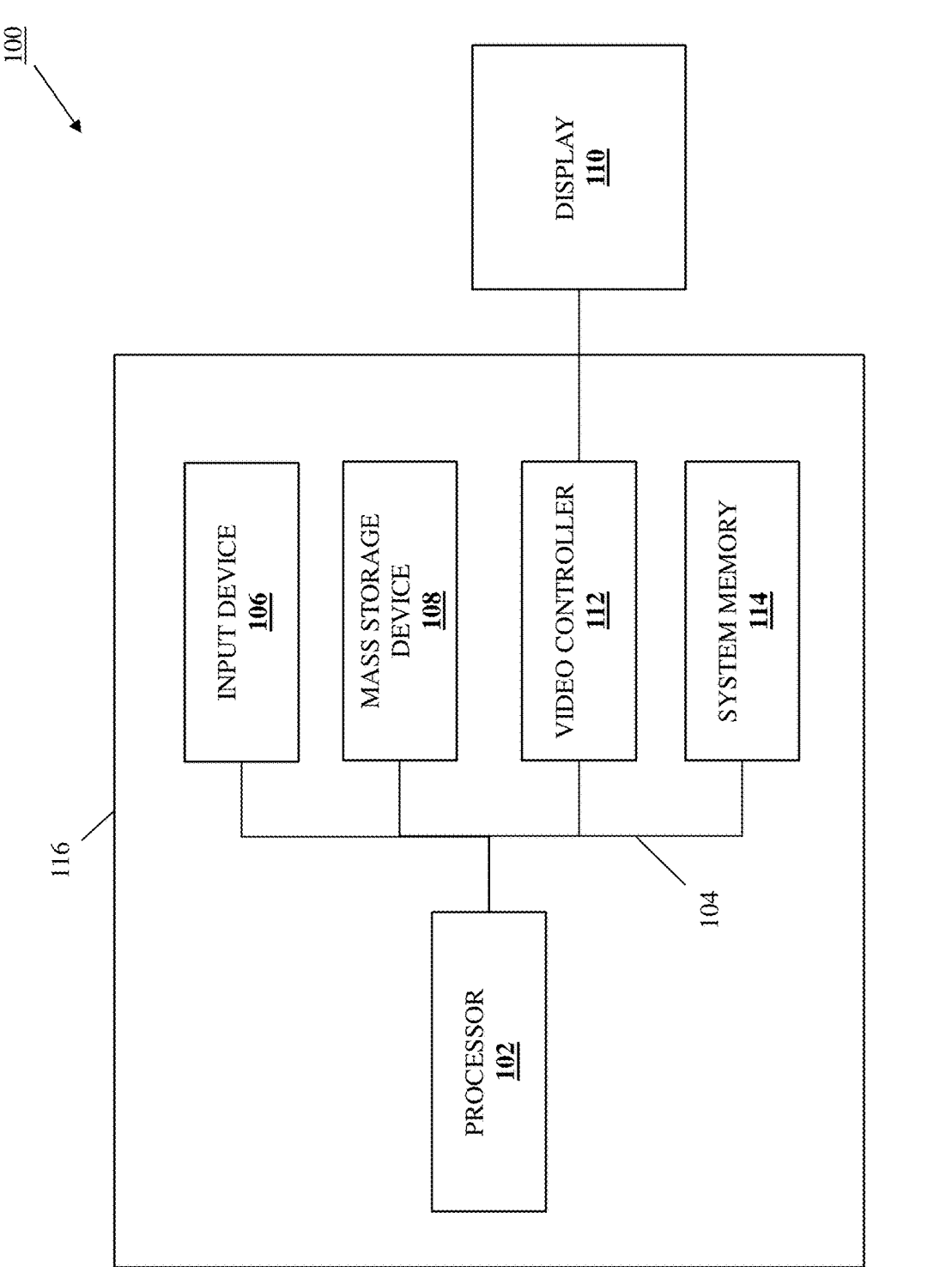
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
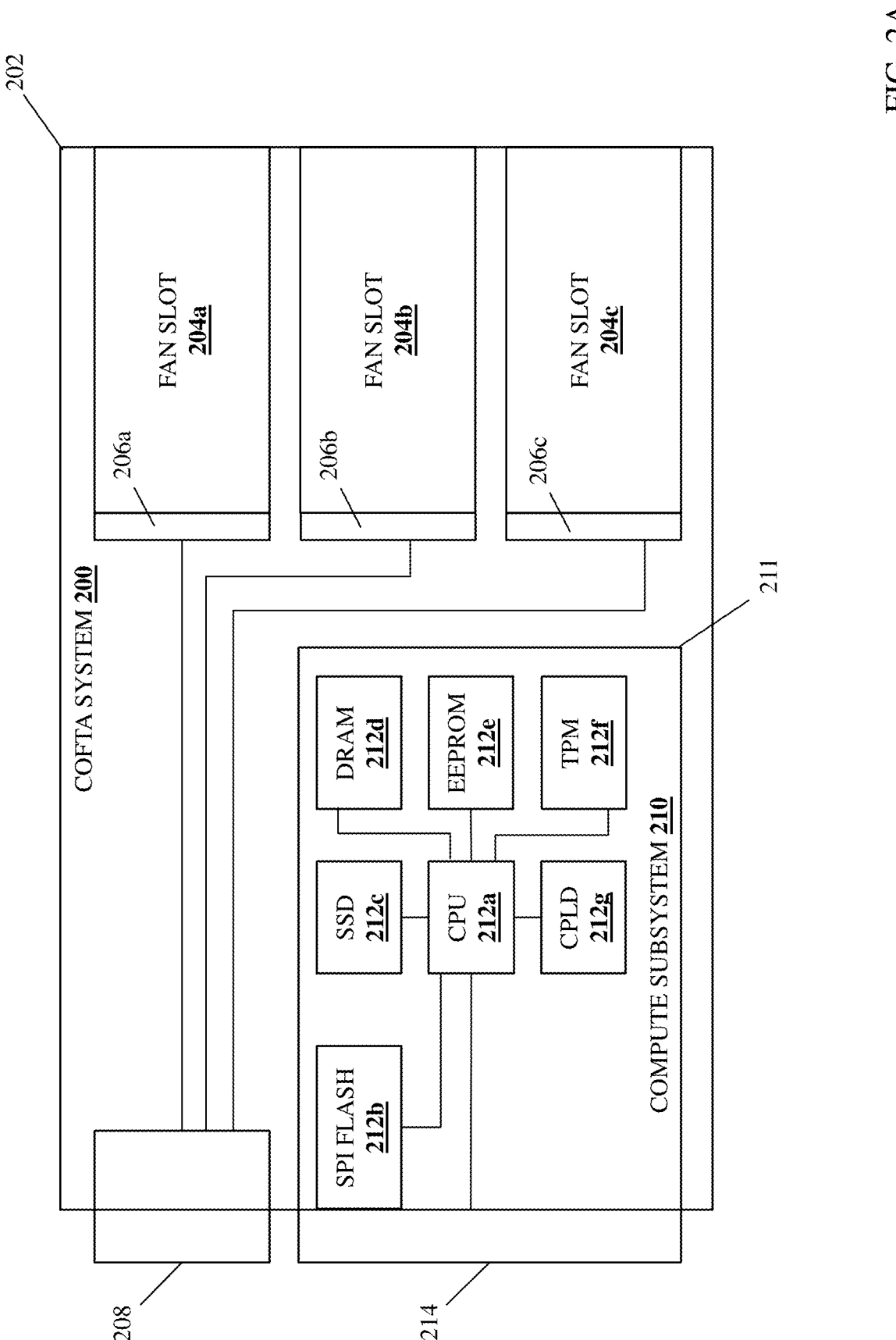
FIG. 2A is a schematic view illustrating an embodiment of a COFTA system that may be provided according to the teachings of the present disclosure.
Figure 2B:
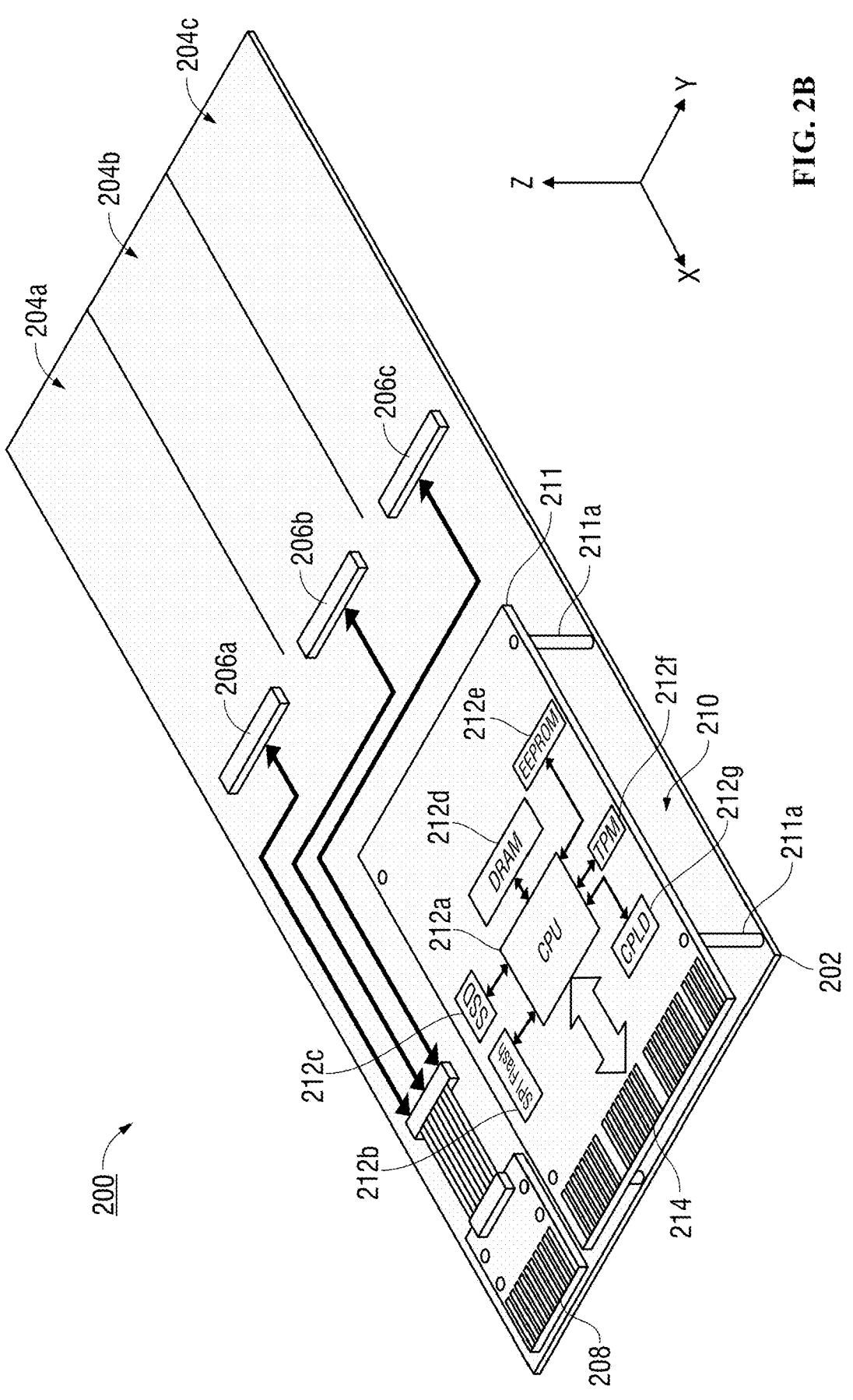
FIG. 2B is a perspective view illustrating an embodiment of the COFTA system of FIG. 2A.

Referring now to FIGS. 2A and 2B, an embodiment of a Compute-On-Fan-Tray-Assembly (COFTA) system 200 is illustrated that may be provided according to the teachings of the present disclosure. In the illustrated embodiment, the COFTA system 200 includes a fan chassis 202 that supports the components of the COFTA system 200. As will be appreciated by one of skill in the art in possession of the present disclosure, the fan chassis 202 of the COFTA system 200 may be considered a "fan tray assembly" that is configured support one or more fan modules, as well as configured to be positioned in a networking device (or other computing device) to couple those fan module(s) to the networking device (or other computing device) in order to allow those fan modules to be used to provide cooling for the networking device (or other computing device). As such, the fan chassis 202 may include any of a variety of device coupling features that one of skill in the art in possession of the present disclosure would appreciate allow the coupling of the fan chassis 202 to the networking device as described below.

In the illustrated embodiment, the fan chassis 202 is configured to support three fan modules, and includes a fan coupling subsystem that includes fan slots 204a, 204b, and 204c located adjacent a rear edge of the fan chassis 202. As will be appreciated by one of skill in the art in possession of the present disclosure, each of the fan slots 204a-204c may include any of a variety of fan module coupling features that are configured to couple the fan modules to the fan chassis 202 as described below. However, while the specific examples provided herein describe a fan chassis 202 with a fan coupling subsystem configured to support three fan modules, one of skill in the art in possession of the present disclosure will appreciate how the fan chassis 202 may be configured to support fewer fan modules (including a single fan module) or more fan modules while remaining within the scope of the present disclosure as well. For example, the number of fan modules supported by the fan chassis 202 may be dictated by the width of the circuit board required to support the components of the compute subsystem 210 (discussed in further detail below).

The fan chassis 202 may also be provided with a respective fan module connector for each fan module it is configured to support, and thus includes a fan module connector 206a, 206b, and 206c located adjacent each of the fan slots 204a, 204b, and 204c, respectively, in the embodiments illustrated and described below. The fan chassis 202 is also provided with a fan controller connector 208 that is coupled to each of the fan module connectors 206a-206c, and as described below the fan controller connector 208 may be configured to aggregated signals received from fan modules via the fan module connectors 206a-206c, as well as split signals received for fan modules connected to the fan module connectors 206a-206c.

As illustrated, a compute subsystem 210 may be mounted to the fan chassis 202. For example, the compute subsystem 210 may include a circuit board 211 that, as can be seen in FIG. 2B, may be mounted to the fan chassis 202 via a plurality of stand-offs 211a (i.e., the two stand-offs 211a visible in FIG. 2B engaging the circuit board 211 adjacent its corners along a common edge, as well as two stand-offs that are not visible in FIG. 2B but that may engage the circuit board 211 opposite the circuit board 211 from the visible stand-offs 211*a* adjacent its corners along a common opposing edge) in order to provide the circuit board 211 in a spaced-apart orientation along a Z-axis from the adjacent surface of the fan chassis 202 in order to, for example, provide additional thermal cooling for the compute subsystem 210 by allowing airflow from fan modules (described in further detail below) to move past opposing surfaces (e.g., the top and bottom surfaces in FIG. 2B) of the circuit board 211.

As will be appreciated by one of skill in the art in possession of the present disclosure, the compute subsystem 210 may include any of a variety of compute components. For example, in the embodiments illustrated and discussed below, the compute subsystem 210 includes a primary processing system provided by a Central Processing Unit (CPU) 212*a* that is coupled to storage devices provided by a Serial Peripheral Interface (SPI) flash storage device 212*c* and an Solid State Drive (SSD) storage device 212*c*, memory devices provided by Dynamic Random Access Memory (DRAM) device(s) 212*d* and an Electronically Erasable Programmable Read-Only Memory (EEPROM) device 212*e*, a security device provided by a Trusted Platform Module (TPM) device, and a secondary processing device provided by a Complex Programmable Logic Device (CPLD) 212*e*. However, while specific processing devices, storage devices, memory devices, and security devices are illustrated and described herein, one of skill in the art in possession of the present disclosure will appreciate how the compute subsystem 210 may include any of a variety of processing devices, storage devices, memory devices, security devices, and/or other devices based on the compute functionality required from the compute subsystem 210 for any particular COFTA application.

As can be seen in FIGS. 2A and 2B, the compute subsystem 210 includes a networking device connector 214 that, in the illustrated example, is coupled to the CPU 212*a*. In a specific embodiment, the compute subsystem 210 may be an adaptation of a Compute-On-Module (COM) Express device that includes a modified connector, and thus may be provided with a COM Express form-factor with the exception of that modified connector. For example, the networking device connector 214 may be configured similarly to a COM Express device connector, with the exception that the networking device connector 214 is oriented, and configured to connect along, an X-axis (i.e., the axis parallel to the circuit board 210 and the fan chassis 202) rather than an Z-axis (i.e., the axis perpendicular to the circuit board 210 and the fan chassis 202) that conventional COM Express device connectors are oriented and configured to connect along. However, while a specific compute subsystem and networking device connector are illustrated and described, one of skill in the art in possession of the present disclosure will appreciate how other compute subsystems and networking device connectors will fall within the scope of the present disclosure as well. Furthermore, while a specific COFTA system 200 has been illustrated and described, one of skill in the art in possession of the present disclosure will recognize that the COFTA system of the present disclosure may include a variety of components and component configurations while remaining within the scope of the present disclosure as well.

Figure 3A:
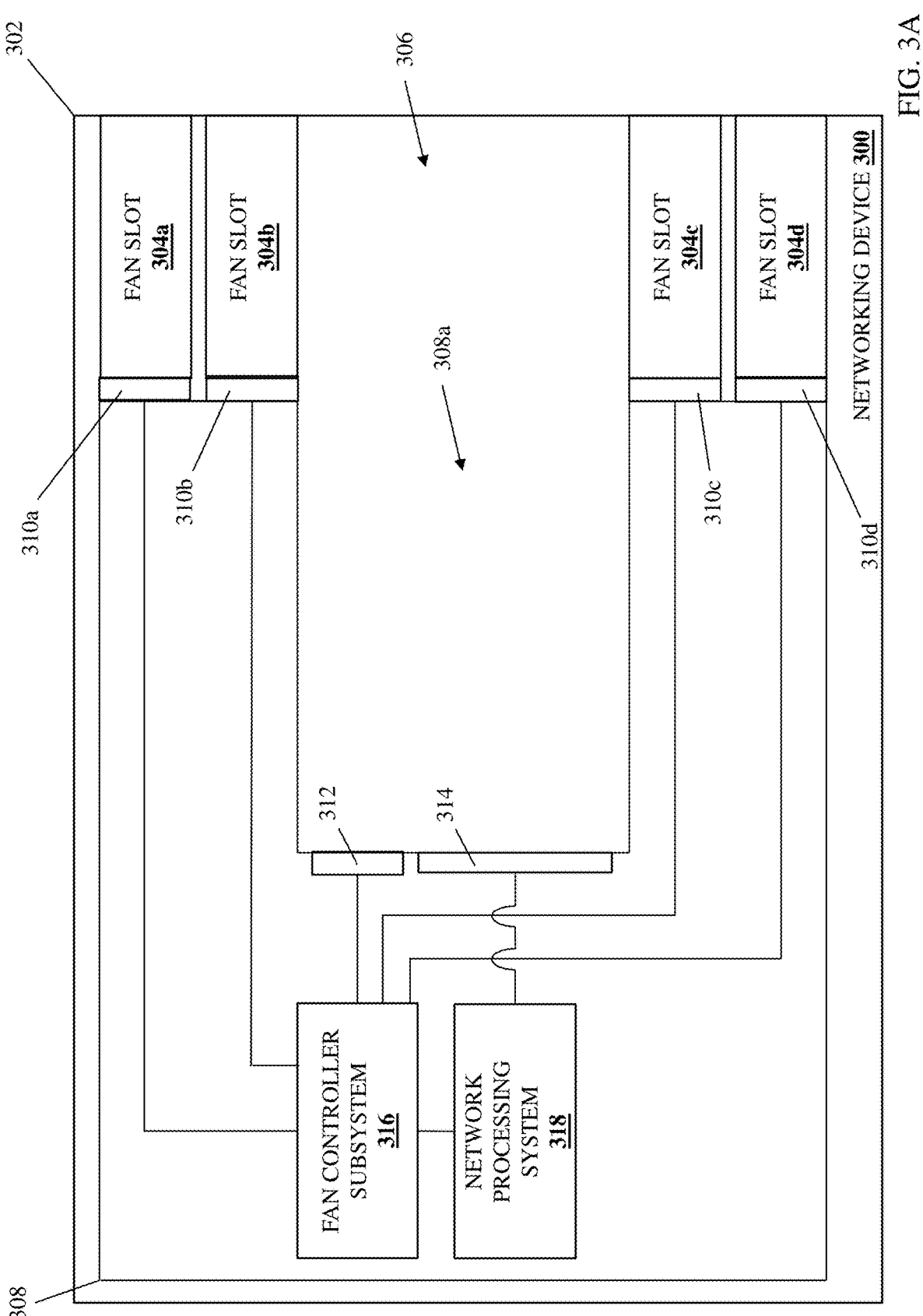
FIG. 3A is a schematic view illustrating an embodiment of a networking device that may be used with the COFTA system of FIGS. 2A and 2B.
Figure 3B:
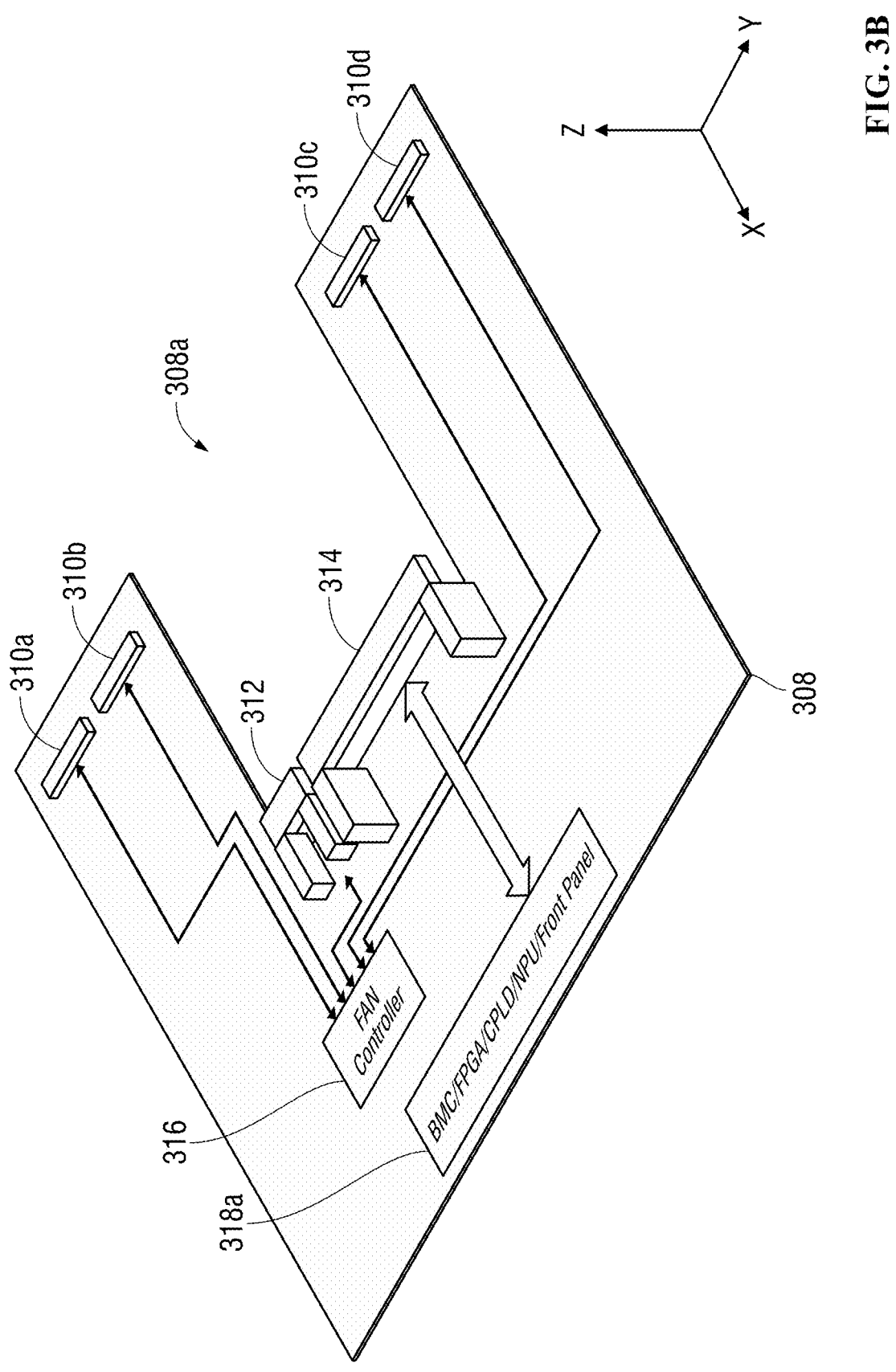
FIG. 3B is a perspective view illustrating an embodiment of a motherboard in the networking device of FIG. 3A.

Referring now to FIGS. 3A and 3B, an embodiment of a networking device 300 is illustrated that may be used with the COFTA system of FIGS. 2A and 2B. In an embodiment, the networking device 300 may be provided by the IHS 100 discussed above with reference to FIG. 1 and/or may include some or all of the components of the IHS 100, and in specific examples may be provided by a switch device. However, while illustrated and discussed as being provided by a switch device, one of skill in the art in possession of the present disclosure will recognize that the functionality of the networking device 300 discussed below may be provided by other devices that are configured to operate similarly as discussed below. For example, one of skill in the art in possession of the present disclosure will appreciate how the COFTA system of the present disclosure may be utilized in a server device similarly as COM Express devices are utilized with relatively "low-end" (or otherwise relatively inexpensive) server devices to provide the CPUs in those server devices. As such, in some embodiments of the present disclosure the networking device 300 may be replaced by a server device, with components in that server device replacing the network processing system 318 and being coupled to the compute subsystem connector 314 discussed below.

In the illustrated embodiment, the networking device 300 includes a device chassis 302 that houses the components of the networking device 300, only some of which are illustrated and described below. For example, the device chassis 302 may include a fan coupling subsystem that includes fan slots 304*a*, 304*b*, 304*c*, and 304 that are located adjacent a rear wall of the device chassis 302. As will be appreciated by one of skill in the art in possession of the present disclosure, each of the fan slots 304*a*-204*c* may include any of a variety of fan module coupling features that are configured to couple the fan modules to the device chassis 302 as described below.

Furthermore, the device chassis 302 may also include a COFTA coupling subsystem that includes a COFTA slot 306 that one of skill in the art in possession of the present disclosure will appreciate operates to provide one or more additional fan slots (i.e., 3 additional fan slots in the specific examples provided below) on the device chassis 302 that are located adjacent the rear wall of the device chassis 302 (i.e., the COFTA system 200 is configured to be positioned in fan slot(s) on the device chassis 302 that provide the COFTA slot 306). As such, one of skill in the art in possession of the present disclosure will appreciate how the COFTA slot in networking devices described below may be provided in place of some number of fan slots that would otherwise be provided in a conventional version of those networking devices. As will be appreciated by one of skill in the art in possession of the present disclosure, the COFTA slot 306 may include any of a variety of COFTA system coupling features that are configured to couple the fan chassis 202 in the COFTA system 200 to the device chassis 302 as described below.

However, while the specific examples provided herein describe a device chassis 302 with a fan coupling subsystem and COFTA coupling subsystem that is configured to support seven fan modules, one of skill in the art in possession of the present disclosure will appreciate how the device chassis 302 may be configured to support fewer fan modules (including a single fan module) or more fan modules while remaining within the scope of the present disclosure as well.

As illustrated, the device chassis 302 may house a motherboard 308 that is configured to support the components of the networking device 300. In the specific examples provided herein, the motherboard 308 defines a COFTA channel 308*a* that provides the motherboard 308 with a "U" shape that one of skill in the art in possession of the present disclosure will appreciate is configured to allow the COFTA system 200 of FIGS. 2A and 2B to be moved into and positioned in the device chassis 302. The motherboard 308 may also be provided with fan module connectors for each fan module that the networking device 300 is configured to support, and thus includes a fan module connector 310a, 310b, 310c, and 310d located adjacent each of the fan slots 304a, 304b, 304c, and 304d, respectively, as well as a fan subsystem connector 312 located adjacent the COFTA channel 308a in the embodiments illustrated and described below. The motherboard 308 also includes a compute subsystem connector 314 that is located adjacent the COFTA channel 308, and one of skill in the art in possession of the present disclosure will appreciate how the compute subsystem connector 314 may be elevated from the adjacent surface of the motherboard 308 (e.g., in the Z-axis) relative to the fan subsystem connector 312 (as can be seen in FIG. 3B) in embodiments in which the circuit board 211 and networking device connector 214 on the compute subsystem 210 are elevated as illustrated in FIG. 2B.

A fan controller subsystem 316 is mounted to the motherboard 308 and is coupled (e.g., via traces in the motherboard 308) to each of the fan module connectors 310a-310d and the fan subsystem connector 312. A network processing system 318 is also mounted to the motherboard 308 and connected (e.g., via a network processing system connector 318a, visible in FIG. 3B, and traces in the motherboard 308) to each of the fan controller subsystem 316 and the compute system connector 314. As discussed above, in some embodiments the network processing system 318 may be provided by a Network Processing Unit (NPU). However, as illustrated in FIG. 3B, the network processing system connector 318a may additionally) connect other processing systems (e.g., a Field Programmable Gate Array (FPGA) device, a CPLD, etc.), a Baseboard Management Controller (BMC) device, a front panel subsystem including a console port, an out-of-band management port, Light Emitting Devices (LEDs), and/or other systems to the compute subsystem connector 314 while remaining within the scope of the present disclosure as well. As such, while a specific networking device 300 has been illustrated and described, one of skill in the art in possession of the present disclosure will recognize that networking devices (or other devices operating according to the teachings of the present disclosure in a manner similar to that described below for the networking device 300) may include a variety of components and/or component configurations for providing conventional networking functionality, as well as the COFTA functionality discussed below, while remaining within the scope of the present disclosure as well.

Figure 4:
FIG. 4 is a flow chart illustrating an embodiment of a method for providing a compute system in a networking device.
Figure 4:
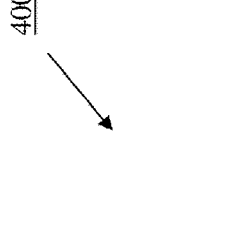
Figure 4:
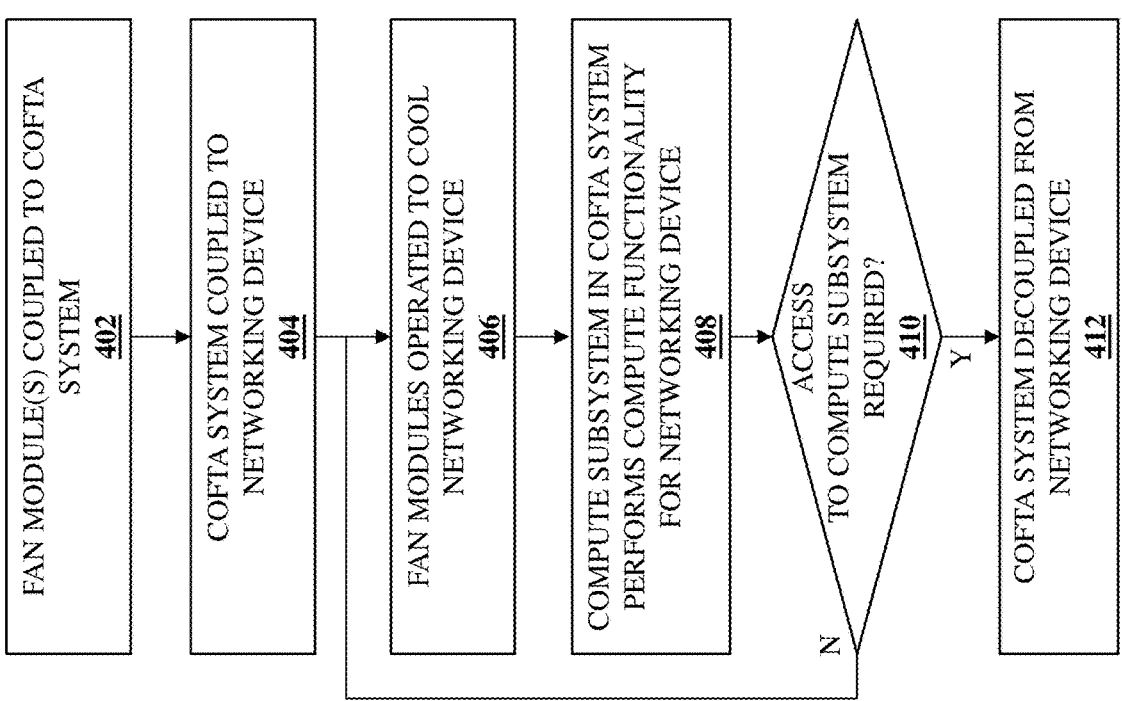

Referring now to FIG. 4, an embodiment of a method 400 for providing a compute system in a networking device is illustrated. As discussed below, the systems and methods of the present disclosure provide a Compute-On-Fan-Tray-Assembly (COFTA) system that includes a compute subsystem mounted to a fan chassis that may be easily coupled to, and decoupled from, a networking device. For example, the COFTA system of the present disclosure may include a fan chassis that is configured to be positioned in a networking device, and that has a fan module coupling subsystem that is configured to couple at least one fan module to the fan chassis. A compute subsystem is mounted to the fan chassis and is configured to perform compute functionality for the networking device. A networking device connector is included on the fan chassis, is coupled to the compute subsystem, and is configured to engage a compute subsystem connector in the networking device to couple the compute subsystem to a network processing system in the networking device when the fan chassis is positioned in the networking device. As described below, embodiments of the COFTA system of the present disclosure allow the compute subsystem for the networking device to be connected to, and disconnected from, the networking device without the need to remove the networking device from its rack or suspend networking functionality performed by the network processing system in the networking device, eliminating issues with servicing and/or replacement of such compute subsystems, and enabling the upgrading (or downgrading) of such compute subsystems.

The method 400 begins at block 402 where one or more fan modules are coupled to a COFTA system. With reference to the specific example provided in FIG. 5A, in an embodiment of block 402, three fan modules may be coupled to the fan chassis 202 in the COFTA system 200 of FIGS. 2A and 2B. In an embodiment, the fan modules 500 may be provided using configurable airflow direction fan modules like those described by the inventors of the present disclosure in U.S. patent application Ser. No. 18/479,235, filed on Oct. 2, 2023, the disclosure of which is incorporated by reference herein in its entirety. However, one of skill in the art in possession of the present disclosure will appreciate how the use of a variety of other types of fan modules with the COFTA system 200 will fall within the scope of the present disclosure as well.

Figure 5A:
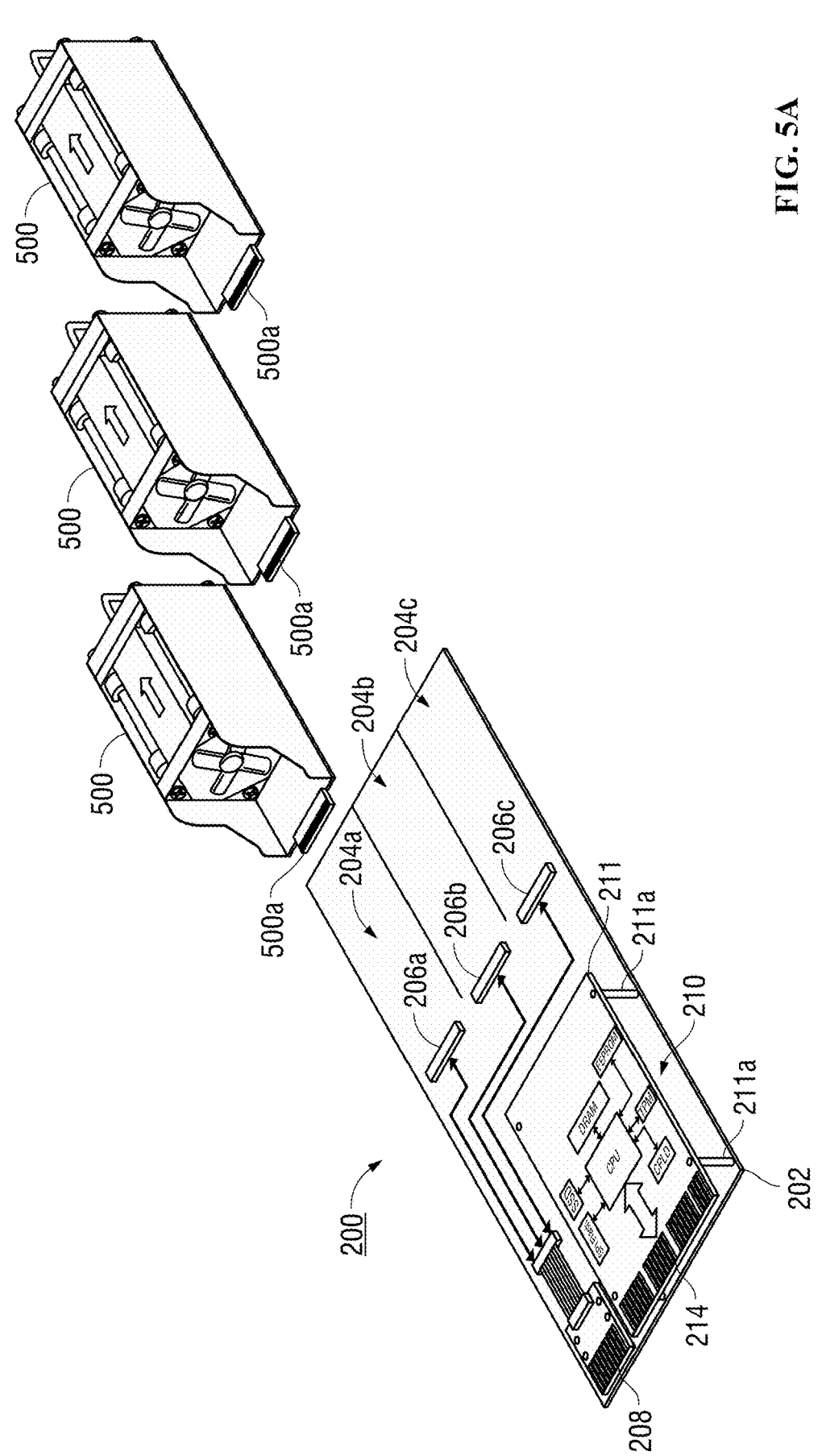
FIG. 5A is a perspective view illustrating an embodiment of a plurality fan modules being coupled to the COFTA system of FIGS. 2A and 2B.
Figure 5B:
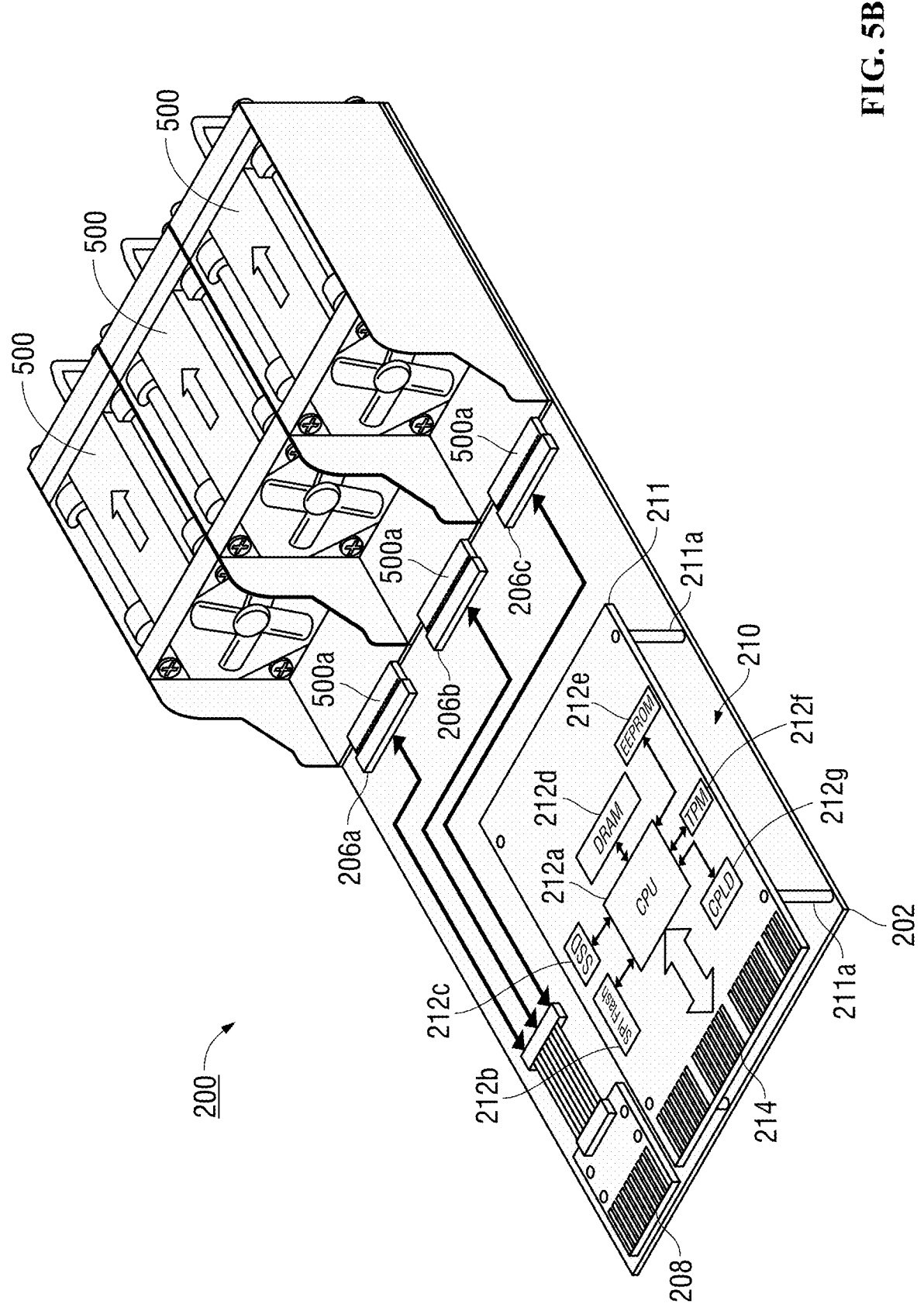
FIG. 5B is a perspective view illustrating an embodiment of a plurality fan modules coupled to the COFTA system of FIGS. 2A and 2B.

As illustrated, each of the fan modules 500 may include features for coupling that fan module to the fan chassis 202, a corresponding fan chassis connector 500a that one of skill in the art in possession of the present disclosure will appreciate is coupled to a fan device in the fan module, and/or any other fan module features known in the art. At block 402, each of the three fan modules 500 may be positioned adjacent the rear edge of the fan chassis 202 such that that fan module 500 is aligned with one of the fan slots 204a-204c, with its fan chassis connector 500a located adjacent that fan slot as illustrated in FIG. 5A. With reference to FIGS. 5B and 5B, each of the three fan modules 500 may then be moved towards the fan chassis 202 such that each fan module 500 engages its corresponding fan slot 204a-204c, respectively, with continued movement of the fan modules 500 through the fan slots 204a-204c causing their corresponding fan chassis connectors 500a to engage the fan module connectors 206a-206c to couple each of those fan modules 500 to the fan controller connector 208.

Figure 6:
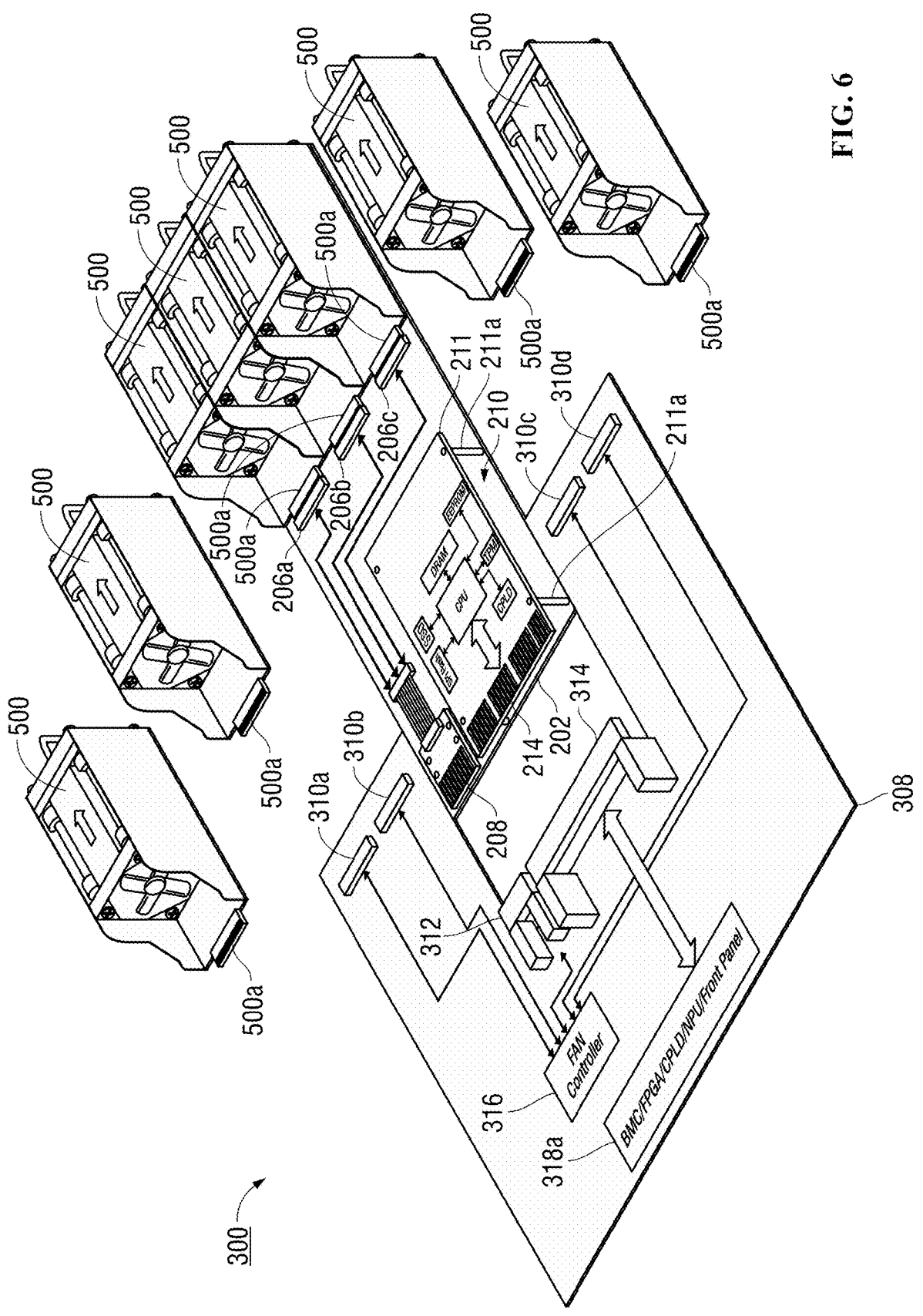
FIG. 6 is a perspective view illustrating an embodiment of a plurality fan modules and the COFTA system of FIGS. 5B and 5C being coupled to the networking device of FIGS. 3A and 3B.
Figure 7A:
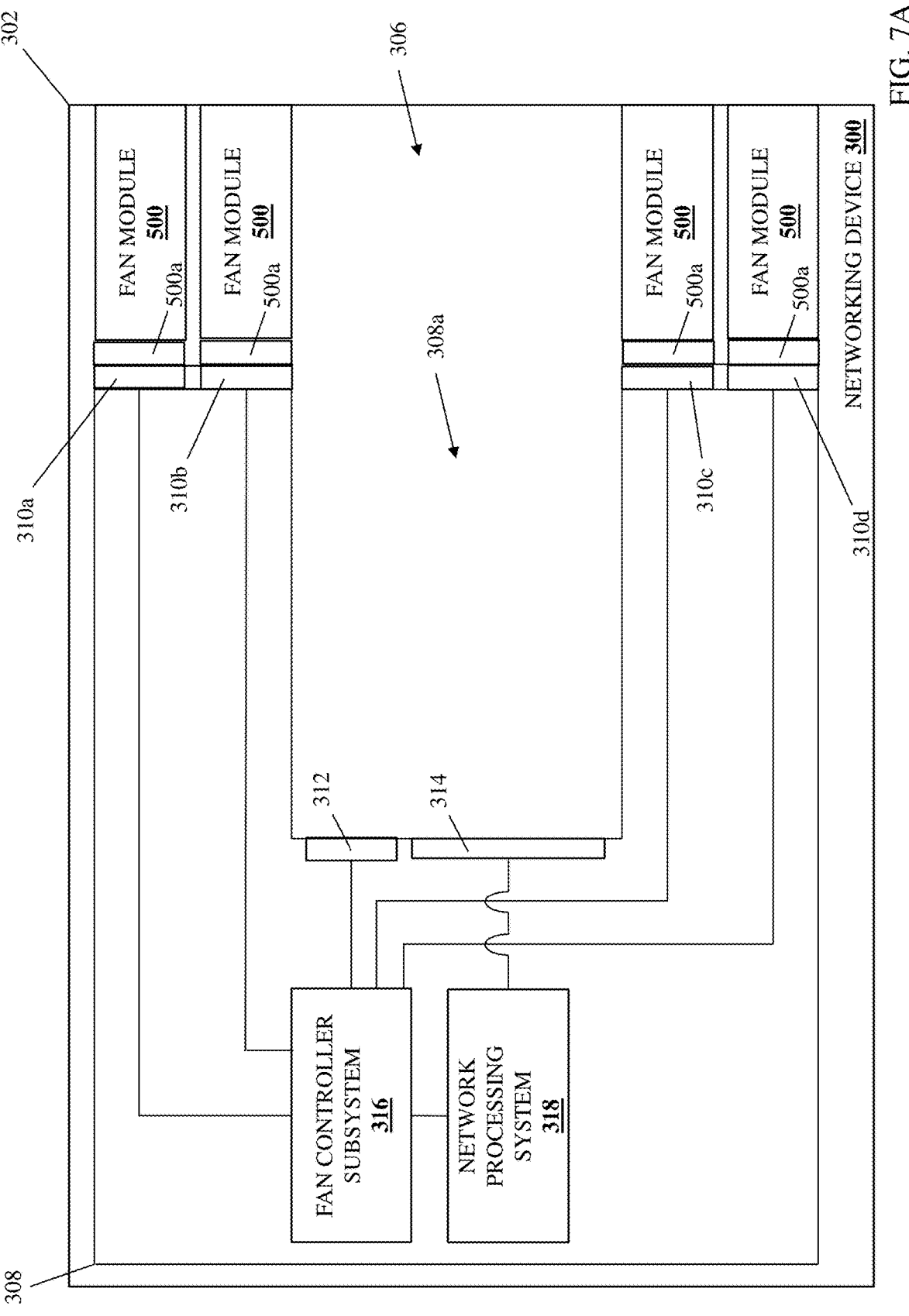
FIG. 7A is a schematic view illustrating an embodiment of a plurality fan modules coupled to the networking device of FIGS. 3A and 3B.
Figure 7B:
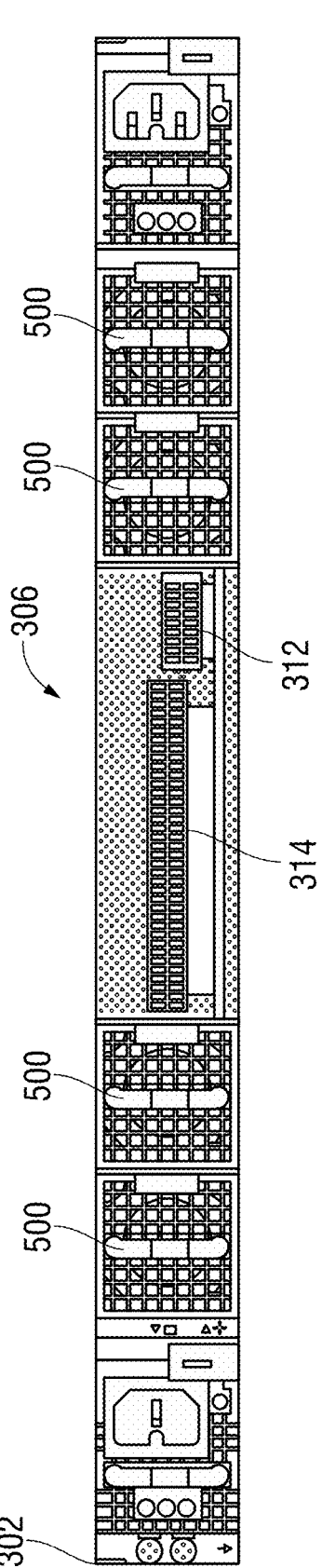
FIG. 7B is a rear view illustrating an embodiment of a plurality fan modules coupled to the networking device of FIGS. 3A and 3B.

In the specific example provided herein, four of the fan modules 500 may also be coupled directly to the networking device 300 as well. For example, with reference to FIG. 6, each of the four fan modules 500 may be positioned adjacent the rear wall of the device chassis 302 (not visible in FIG. 6) such that that fan module 500 is aligned with one of the fan slots 304a-304d (not visible in FIG. 6), with its fan chassis connector 500a is located adjacent that fan slot. Each of the four fan modules 500 may then be moved towards the device chassis 302 such that each fan module 500 engages its corresponding fan slot 304a-304d, respectively, with continued movement of the fan modules 500 through the fan slots 304a-304d causing their corresponding fan chassis connectors 500a to engage the fan module connectors 310a-310d, as illustrated in FIG. 7A, to couple each of those fan modules 500 to the fan controller subsystem 316. With reference to FIG. 7B, the rear of the networking device 300 is illustrated with the four fan modules 500 coupled to networking device 300 as described above, and with the fan subsystem connector 312 and compute subsystem connector 314 visible via the COFTA slot 306.

Figure 5C:
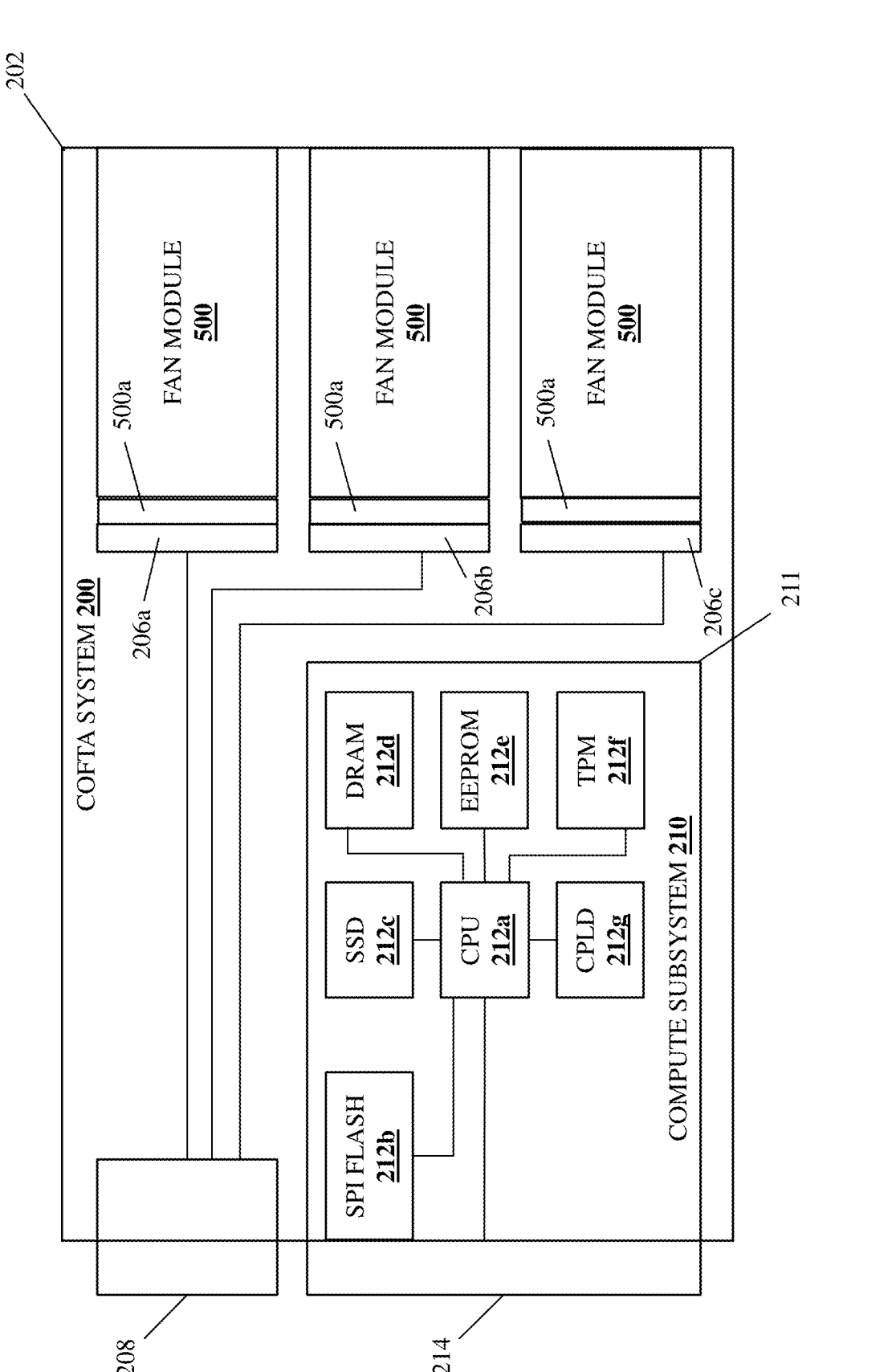
FIG. 5C is a schematic view illustrating an embodiment of a plurality fan modules coupled to the COFTA system of FIGS. 2A and 2B.
Figure 8:
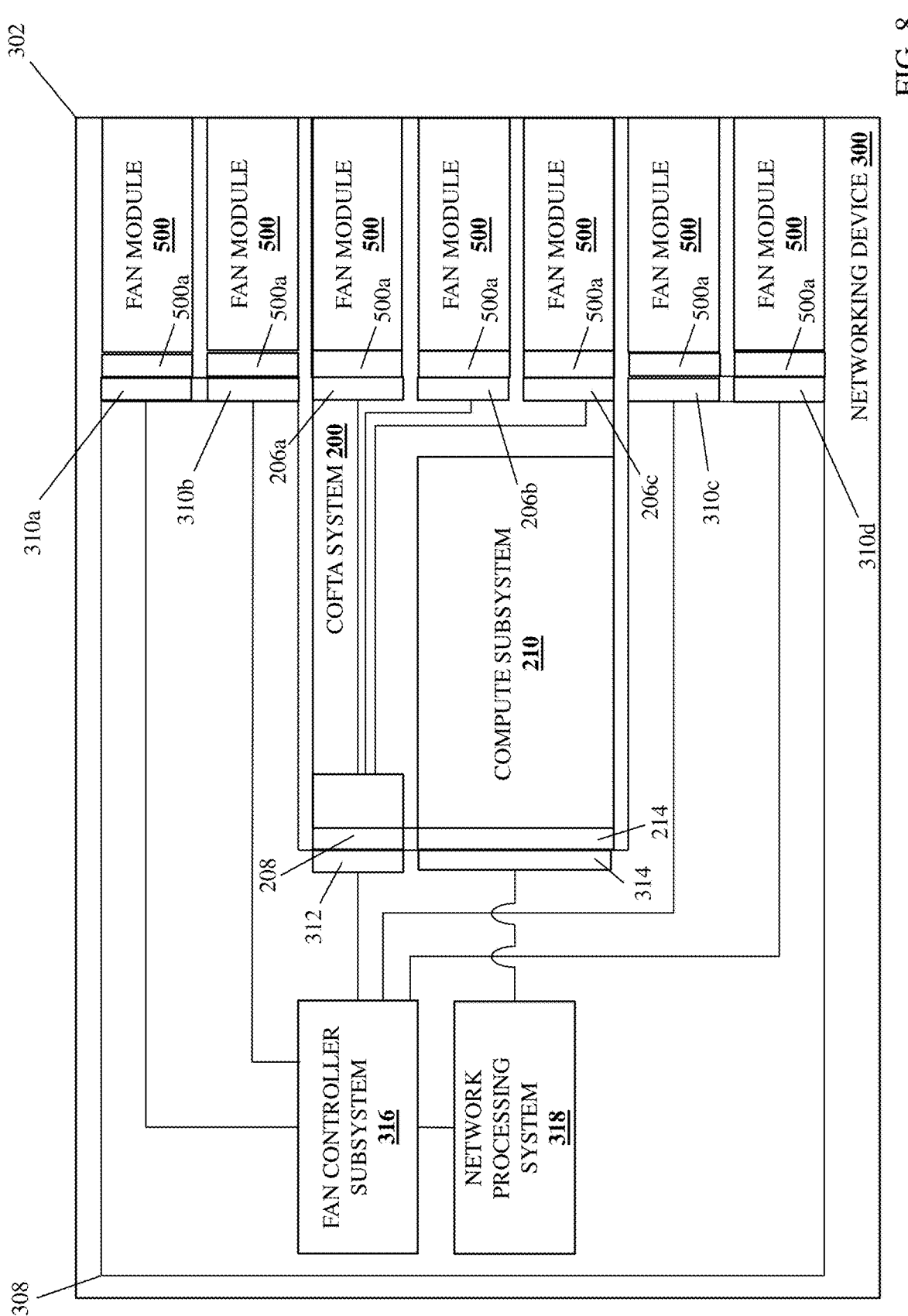
FIG. 8 is a schematic view illustrating an embodiment of the COFTA system of FIGS. 5B and 5C coupled to the networking device of FIGS. 7A and 7B.

The method 400 then proceeds to block 404 where the COFTA system is coupled to a networking device. With reference back to FIG. 6, in an embodiment of block 404, the COFTA system 200 including the three fan modules coupled thereto as described above with reference to FIGS. 5B and 5C may be positioned adjacent the rear wall of the device chassis 302 (not visible in FIG. 6) such that that COFTA system is aligned with the COFTA slot 306 (not visible in FIG. 6), with its fan controller connector 208 and networking device connector 214 located adjacent the COFTA slot 306. The COFTA system 200 may then be moved towards the device chassis 302 such that it engages the COFTA slot 306, with continued movement of the COFTA system 200 through the COFTA slot 306 causing the COFTA system 200 to move through the COFTA channel 308a defined by the motherboard 308 until its fan controller connector 208 and networking device connector 214 engage the fan subsystem connector 312 and the compute subsystem connector 314, respectively, on the motherboard 308 in the networking device 300, as illustrated in FIG. 8, to couple each of the fan modules 500 on the COFTA system 200 to the fan controller subsystem 316, and couple the compute subsystem 210 to the network processing system 318.

Figure 9:
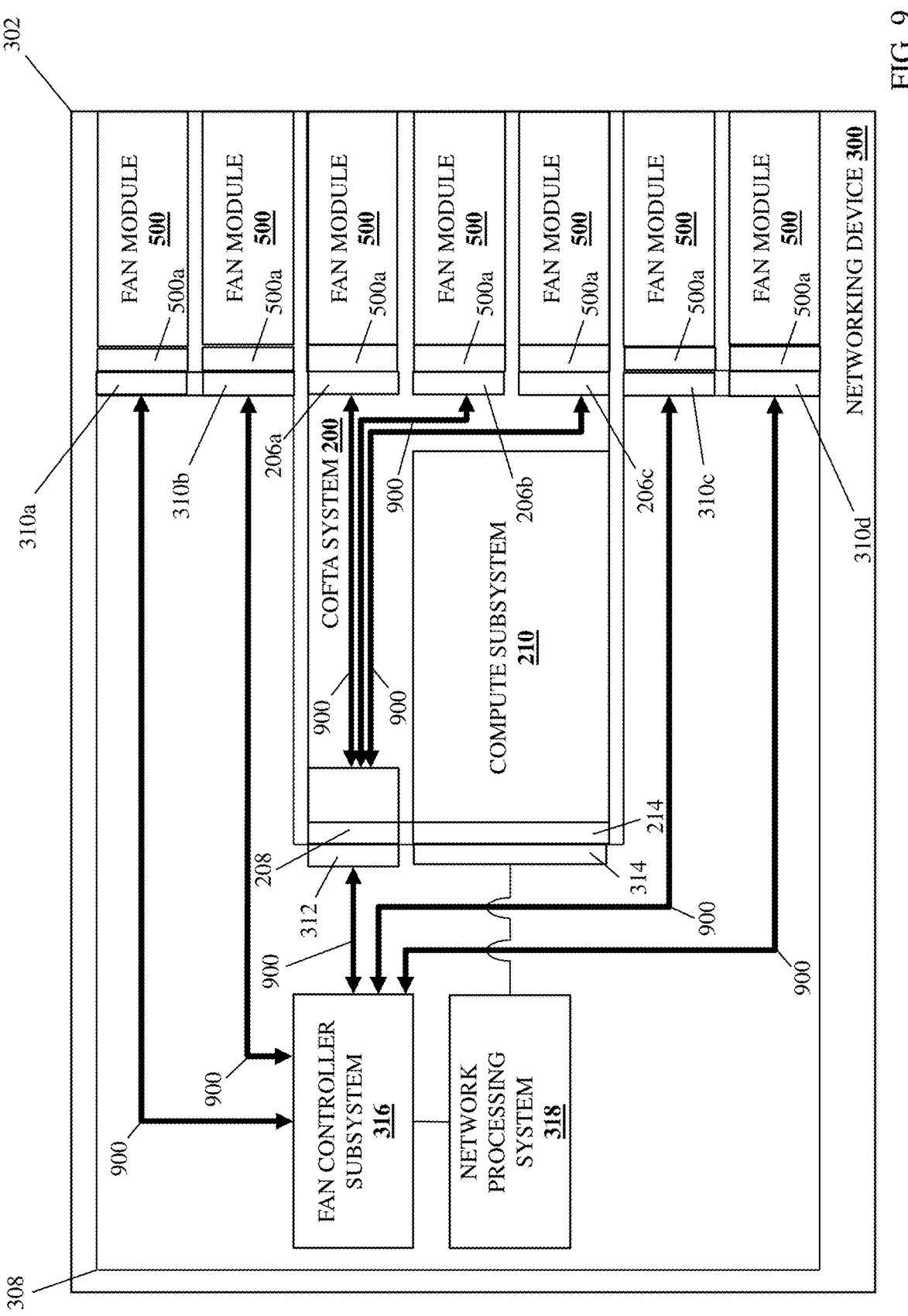
FIG. 9 is a schematic view illustrating an embodiment of the COFTA system of FIGS. 2A and 2B and the networking device of FIGS. 3A and 3B operating during the method of FIG. 4.

The method 400 then proceeds to block 406 where the fan modules are operated to cool the networking device. With reference to FIG. 9, in an embodiment of block 406, the fan controller subsystem 316 may perform fan control operations 900 that include using any of a variety of fan control techniques known in the art to control the fan modules 500 coupled to the fan module connectors 310a-310d on the motherboard 308, as well as to control the fan modules 500 coupled to fan subsystem connector 312 on the motherboard 308 (e.g., via the connection of the fan controller connector 208 on the COFTA system 200 to the fan subsystem connector 312, and the coupling of the fan module connectors 206a-206c on the COFTA system 200 to the fan controller connector 208), in order to operate any of the fan modules 500 to produce an airflow through the device chassis 302 to cool any components housed in the device chassis 302 (e.g., the network processing system 318, the compute subsystem 210, as well as any of a variety of unillustrated components that would be apparent to one of skill in the art in possession of the present disclosure). As will be appreciated by one of skill in the art in possession of the present disclosure, prior to operating the fan modules 500 to cool the networking device 300, the fan control operations 900 may include fan module detection and programming operations that detect and program each of the fan modules 500 in a similar manner (regardless of whether they are directly coupled to the motherboard 308 or coupled to the motherboard 308 via the COFTA system 200).

As described above, in embodiments in which the circuit board 211 for the compute subsystem 210 is mounted to the fan chassis 202 via the plurality of stand-offs 211a to provide the circuit board 211 in the spaced-apart orientation along the Z-axis from the adjacent surface of the fan chassis 202 as illustrated in FIG. 2B, additional thermal cooling may be provided for the compute subsystem 210 by allowing the airflow produced by the fan modules 500 to move past opposing surfaces (e.g., the top and bottom surfaces in FIG. 2B) of the circuit board 211. Furthermore, as discussed briefly above and as will be appreciated by one of skill in the art in possession of the present disclosure, the fan controller connector 208 on the COFTA system 200 may be configured to aggregate signals from the fan modules 500 coupled to the COFTA system 200 and provide the aggregated signal to the fan controller subsystem 316, while allowing a signal received from the fan controller subsystem 316 to be provided to each of the fan modules 500 coupled to the COFTA system 200 as well. However, while the aggregation of signals from fan modules 500 on the COFTA system 200 and the provisioning of an aggregated signal to the fan controller subsystem 316 on the networking device 300 (and the splitting of a signal from the fan controller subsystem 316 between those fan modules 500) has been described, one of skill in the art in possession of the present disclosure will appreciate how the transmission of separate signals between the fan modules 500 on the COFTA system 200 and the fan controller subsystem 316 will fall within the scope of the present disclosure as well.

Figure 10:
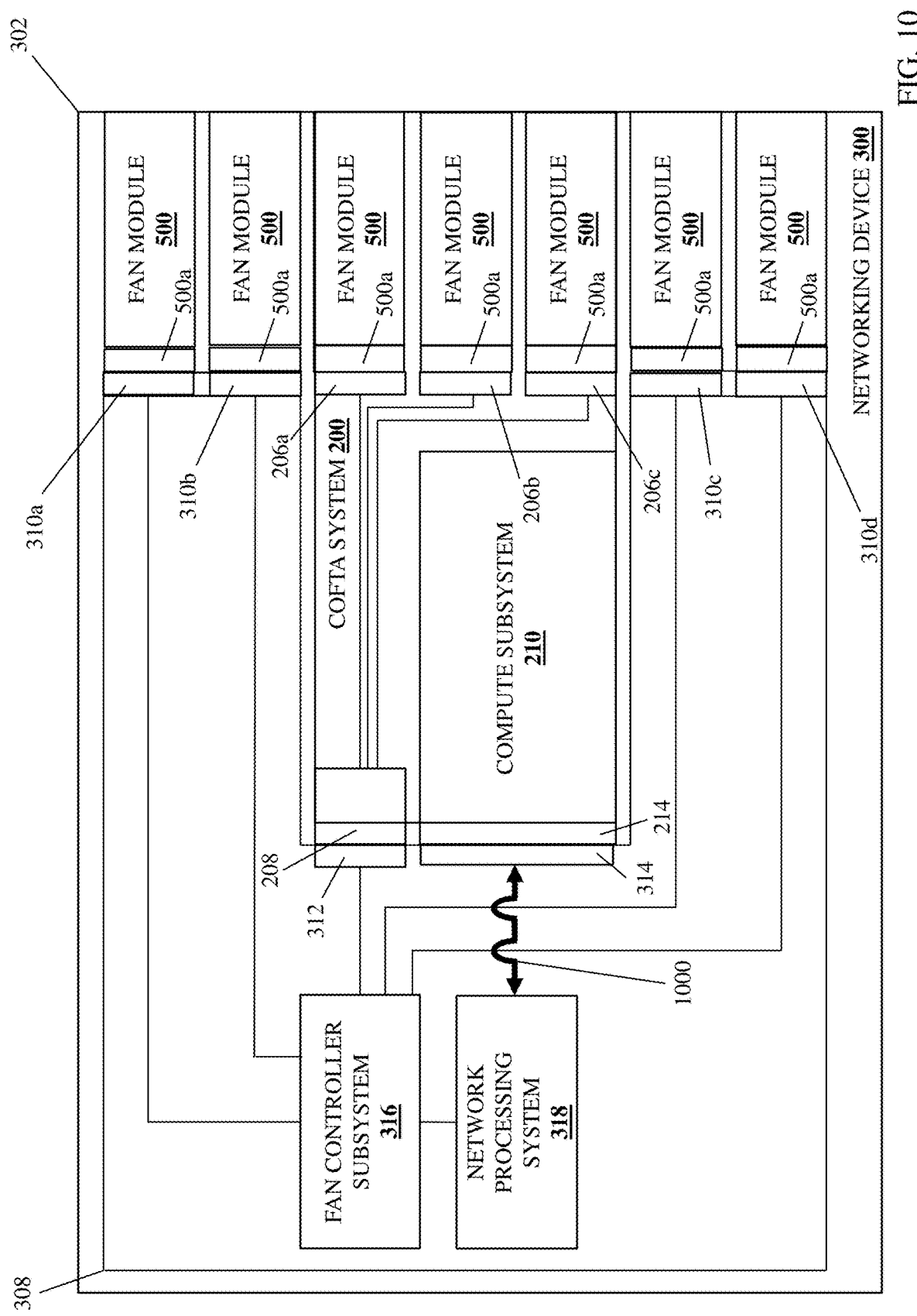
FIG. 10 is a schematic view illustrating an embodiment of the COFTA system of FIGS. 2A and 2B and the networking device of FIGS. 3A and 3B operating during the method of FIG. 4.

The method 400 then proceeds to block 408 where a compute subsystem in the COFTA system performs compute functionality for the networking device. With reference to FIG. 10, in an embodiment of block 408, the compute subsystem 210 may perform compute functionality operations 1000 to provide any of a variety of compute functionality for the networking device 300. For example, the compute functionality operations 1000 may include CPU 212a providing a Network Operating System (NOS) for the networking device 300 by booting up via a BIOS provided using the SPI flash storage device 212b, and providing the NOS following boot using the SSD storage device 212c and the DRAM device(s) 212d. However, while specific compute functionality including providing an NOS is described, one of skill in the art in possession of the present disclosure will appreciate how any of a variety of compute functionality (e.g., security compute functionality using the TPM device 212f) will fall within the scope of the present disclosure as well.

The method 400 then proceeds to decision block 410 where the method 400 proceeds depending on whether access to the compute subsystem is required. Similarly as discussed above for conventional COM Express devices, the compute subsystem 210 on the COFTA system 200 may require servicing or replacement for a variety of reasons that include errors associated with any of the processing systems (e.g., CPU 212a and/or the CPLD 212g), degradation of any of the storage device(s) (e.g., the SPI flash storage device 212b and/or the SSD storage device 212c), issues with the memory device(s) (e.g., the DRAM device(s) and/or the EEPROM device 212e), issues with the security device (e.g., the TPM device 212f) and/or other compute subsystem issues that would be apparent to one of skill in the art in possession of the present disclosure.

Furthermore, in some situations, the upgrade (or downgrade) of the compute subsystem 210 on the COFTA system 200 may be desirable, such as when the NOS requirements for the networking device 300 have changed, storage requirements for the networking device 300 have changed, processing requirements for the networking device 300 have changed, security requirements for the networking device 300 have changed (e.g., an upgraded TPM device is required to address evolving Federal Information Processing Standard (FIPS) requirements), etc. As such, at decision block 410, the method 400 may proceed depending on whether the compute subsystem 210 requires service, replacement, upgrade, or downgrade, as well as any other reason for compute subsystem access that would be apparent to one of skill in the art in possession of the present disclosure. Furthermore, one of skill in the art in possession of the present disclosure will appreciate how access to the compute subsystem 210 may be required if the fan controller connector 208 on the COFTA system 200 requires service, replacement, upgrade, or downgrade as well.

If, at decision block 410, access to the compute subsystem is not required, the method 400 returns to block 406. As such, the method 400 may loop such that the fan modules 500 are operated to cool the networking device 300 (when needed) similarly as described above with reference to block 406, and the compute subsystem 210 in the COFTA system 200 performs compute functionality for the networking device 300 (when needed) similarly as described above with reference to block 410, as long as access to the compute subsystem 210 is not required.

If at decision block 410, access to the compute subsystem is required, the method 400 proceeds to block 412 where the COFTA system is decoupled from the networking device. In an embodiment, at block 412 an in situations in which access to the compute subsystem 210 is required, the COFTA system 200 may be removed from the networking device 300. In some embodiments, prior to removing the COFTA system 200 from the networking device 300 (and thus prior to decoupling the compute subsystem 210 from the motherboard 308 in the networking device and, in turn, from the network processing system 318), a network administrator or other user of the networking device 300 may use the NOS provided by the compute subsystem 210 to instruct the network processing system 318 (e.g., a data plane provided by the network processing system 318) to operate in a "compute detached mode" that configures the network processing system 318 (e.g., the data plane provided by the network processing system 318) to continue to perform networking functionality (e.g., data routing and/or other active data plane operations known in the art) when the compute subsystem 210 is decoupled from the networking device 300.

In addition, in some embodiments, the "compute detached mode" may cause the network processing system 318 to instruct the fan controller subsystem 316 to increase the speed one or more of the fan module(s) 500 coupled to the fan module connectors 310a-310d to compensate for the loss of the fan modules 500 coupled to the COFTA system 200 when the COFTA system 200 is removed from the networking device 200. However, while two specific operations have been described that may be performed when the COFTA system 200 is disconnected from the networking device 300, one of skill in the art in possession of the present disclosure will appreciate how other operations may be performed to compensate for the disconnection of the COFTA system 200 from the networking device 300 while remaining within the scope of the present disclosure as well.

As will be appreciated by one of skill in the art in possession of the present disclosure, the COFTA system 200 may be removed from the networking device 300 may grasping the COFTA system 200 (or the handles included on the fan modules 500 that are coupled to the COFTA system 200, visible in FIG. 5B) and pulling the COFTA system 300 such that the fan controller connector 208 and the networking device connector 214 on the compute subsystem 210 disengage the fan subsystem connector 312 and the compute subsystem connector 314 on the motherboard 308, respectively, to decouple the compute subsystem 210 from the network processing system 318, allowing the COFTA system 300 to move out of the COFTA channel 308a defined by the motherboard 308, and out of the COFTA slot 306 defined by the device chassis 302.

As will be appreciated by one of skill in the art in possession of the present disclosure, the removal of the COFTA system 200 from the networking device 300 allows for servicing, replacement, upgrade, or downgrade of the compute subsystem 210 (or the fan controller connector

208) on the COFTA system 200. For example, in situations in which the compute subsystem 210 (or the fan controller connector 208) on the COFTA system 200 requires service, such service may be performed "in the field" (i.e., at the location of the networking device 300) after removing the COFTA system 200 from the networking device 300, or may simply require the shipping of the COFTA system 200 to an authorized service entity (e.g., with a temporary replacement COFTA system provided for the networking device 300 while the COFTA system 200 is being serviced in some situations), rather than requiring the shipping of the entire networking device 300 as is required in conventional systems. Similarly, the replacement, upgrade, or downgrade of the compute subsystem 210 (or the fan controller connector 208) on the COFTA system 200 system may simply require the replacement COFTA system, upgraded COFTA system, or downgraded COFTA system to be shipped to the location of the networking device 300, and swapped out with the COFTA system 200 similarly as described above.

Furthermore, as discussed above, the networking device 300 may remain in its rack and may be configured to continue to perform networking functionality while the COFTA system 200/compute subsystem 210 is decoupled from the networking device 300, and may also operate to increase the speed of any of the fan module(s) 500 coupled to the fan module connectors 310a-310d (e.g., by doubling the speed of those fan modules 500) to compensate for the removal of the fan modules 500 that are coupled to the COFTA system 200 and ensure that any components in the networking device 300 are adequately cooled while the COFTA system 200 is removed from the networking device 300.

Thus, systems and methods have been described that provide a Compute-On-Fan-Tray-Assembly (COFTA) system that includes a compute subsystem mounted to a fan chassis that may be easily coupled to, and decoupled from, a networking device. For example, the COFTA system of the present disclosure may include a fan chassis that is configured to be positioned in a networking device, and that has a fan module coupling subsystem that is configured to couple at least one fan module to the fan chassis. A compute subsystem is mounted to the fan chassis and is configured to perform compute functionality for the networking device. A networking device connector is included on the fan chassis, is coupled to the compute subsystem, and is configured to engage a compute subsystem connector in the networking device to couple the compute subsystem to a network processing system in the networking device when the fan chassis is positioned in the networking device. As described above, embodiments of the COFTA system of the present disclosure allow the compute subsystem for the networking device to be connected to, and disconnected from, the networking device without the need to remove the networking device from its rack or suspend networking functionality performed by the network processing system in the networking device, eliminating issues with servicing and/or replacement of such compute subsystems, and enabling the upgrading (or downgrading) of such compute subsystems.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

US 12,635,105 B2

13

What is claimed is:

1. A Compute-On-Fan-Tray-Assembly (COFTA) system, comprising:
a fan chassis that includes a fan module coupling subsystem that is configured to couple at least one fan module to the fan chassis, wherein the fan chassis is configured to be positioned in a networking device;
a compute subsystem that is mounted to the fan chassis and that includes a Central Processing Unit (CPU) that is configured to provide a Network Operating System (NOS) for the networking device; and
a networking device connector that is included on the fan chassis, that is coupled to the compute subsystem, and that is configured to engage a compute subsystem connector in the networking device to couple the compute subsystem to a network processing system in the networking device when the fan chassis is positioned in the networking device.

2. The system of claim 1, wherein the fan module coupling subsystem is configured to couple a plurality of fan modules to the fan chassis.

3. The system of claim 1, wherein the networking device connector is configured to engage the compute subsystem connector in response to the fan chassis being moved into the networking device.

4. The system of claim 1, further comprising:
a fan controller connector that is included on the fan chassis, that is coupled to at least one fan module connector that is included on the fan chassis, and that is configured to engage a fan subsystem connector in the networking device to couple the at least one fan module connector to a fan controller subsystem in the networking device when the fan chassis is positioned in the networking device.

5. The system of claim 1, further comprising:
a plurality of standoff elements that mount the compute subsystem to the fan chassis to position the compute subsystem in a spaced-apart orientation from the fan chassis.

6. An Information Handling System (IHS), comprising:
a networking device chassis that defines at least one fan slot;
a network processing system and that is housed in the networking device chassis and that is configured to perform networking functionality;
a fan chassis that includes at least one fan module and that is positioned in the at least one fan slot defined by the networking device chassis;
a compute subsystem that is mounted to the fan chassis and that includes a Central Processing Unit (CPU) that is configured to provide a Network Operating System (NOS) for the networking device; and
a networking device connector that is included on the fan chassis, that is coupled to the compute subsystem, that engages a compute subsystem connector in the networking device chassis to couple the compute subsystem to the network processing system, and that is configured to disengage the compute subsystem connector when the fan chassis is removed from the networking device chassis to decouple the compute subsystem from the network processing system.

7. The IHS of claim 6, wherein the fan chassis includes a plurality of fan modules.

8. The IHS of claim 6, wherein the networking device connector is configured to engage the compute subsystem connector in response to the fan chassis being moved into the networking device.

9. The IHS of claim 6, further comprising:
a fan controller connector that is included on the fan chassis, that is coupled to the at least one fan module, that engages a fan subsystem connector in the networking device chassis to couple the at least one fan module to a fan controller subsystem in the networking device chassis, and that is configured to disengage the fan subsystem connector when the fan chassis is removed from the networking device chassis to decouple the at least one fan module from the fan controller subsystem.

10. The IHS of claim 6, further comprising:
a plurality of standoff elements that mount the compute subsystem to the fan chassis to position the compute subsystem in a spaced-apart orientation from the fan chassis.

11. The IHS of claim 6, wherein the fan chassis includes at least one first fan module and is positioned in at least one first fan slot defined by the networking device chassis, and wherein at least one second module is positioned in at least one second fan slot defined by the networking device chassis.

12. A method for providing a compute system in a networking device, comprising:
moving, by a fan chassis that includes a compute subsystem and at least one fan module, into a networking device;
engaging, by a networking device connector on the fan chassis that is coupled to the compute subsystem and in response to the fan chassis moving into the networking device, a compute subsystem connector in the networking device to couple the compute subsystem to a network processing system in the networking device;
providing, by a Central Processing Unit (CPU) in the compute subsystem while the compute sybsystem is coupled to the network processing system, a Network Operating System (NOS) for the networking device;
moving, by the fan chassis, out of the networking device; and
disengaging, by the networking device connector in response to the fan chassis moving out of the networking device, the compute subsystem connector to decouple the compute subsystem from the network processing system.

13. The method of claim 12, wherein the fan chassis includes a plurality of fan modules.

14. The method of claim 12, further comprising:
engaging, by a fan controller connector on the fan chassis that is coupled to the at least one fan module and in response to the fan chassis moving into the networking device, a fan subsystem connector in the networking device to couple the at least one fan module to a fan controller subsystem in the networking device.

15. The method of claim 14, further comprising:
disengaging, by the fan controller connector in response to the fan chassis moving out of the networking device, the fan subsystem connector to decouple the at least one fan module from the fan controller subsystem.

16. The method of claim 12, wherein the compute subsystem is mounted to the fan chassis via a plurality of standoff elements that position the compute subsystem in a spaced-apart orientation from the fan chassis.

17. The method of claim 12, wherein the fan chassis includes at least one first fan module and is positioned in at least one first fan slot defined by the networking device chassis, and wherein at least one second fan module is positioned in at least one second fan slot defined by the networking device.

\* \* \* \* \*